(12) United States Patent
Peng et al.

(10) Patent No.: US 11,101,360 B2
(45) Date of Patent: Aug. 24, 2021

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Cheng-Yi Peng, Taipei (TW); Wen-Hsing Hsieh, Hsinchu (TW); Wen-Yuan Chen, Yangmei (TW); Jon-Hsu Ho, New Taipei (TW); Song-Bor Lee, Zhubei (TW); Bor-Zen Tien, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/590,220

(22) Filed: Oct. 1, 2019

(65) Prior Publication Data
US 2020/0168716 A1 May 28, 2020

Related U.S. Application Data

(60) Provisional application No. 62/773,092, filed on Nov. 29, 2018.

(51) Int. Cl.
| | | |
|---|---|---|
| *H01L 29/423* | (2006.01) |
| *H01L 29/78* | (2006.01) |
| *H01L 29/16* | (2006.01) |
| *H01L 21/02* | (2006.01) |
| *H01L 29/08* | (2006.01) |

(Continued)

(52) U.S. Cl.
CPC .. *H01L 29/42392* (2013.01); *H01L 21/02521* (2013.01); *H01L 29/0847* (2013.01); *H01L 29/1608* (2013.01); *H01L 29/24* (2013.01); *H01L 29/7851* (2013.01); *H01L 29/78696* (2013.01)

(58) Field of Classification Search
CPC . H01L 29/0673; H01L 29/24; H01L 29/0847; H01L 29/42392; H01L 29/78696
See application file for complete search history.

(56) References Cited

U.S. PATENT DOCUMENTS

| | | | | |
|---|---|---|---|---|
| 6,921,700 B2* | 7/2005 | Orlowski | ......... | H01L 29/42384 257/331 |
| 7,615,429 B2* | 11/2009 | Kim | ................ | H01L 21/823412 257/E21.421 |

(Continued)

FOREIGN PATENT DOCUMENTS

| | | |
|---|---|---|
| KR | 10-2018-0060912 A | 6/2018 |
| KR | 10-2018-0123422 A | 11/2018 |

*Primary Examiner* — Vincent Wall
(74) *Attorney, Agent, or Firm* — McDermott Will & Emery LLP

(57) ABSTRACT

A semiconductor device includes a channel region, a source/drain region adjacent to the channel region, and a source/drain epitaxial layer. The source/drain epitaxial layer includes a first epitaxial layer epitaxially formed on the source/drain region, a second epitaxial layer epitaxially formed on the first epitaxial layer and a third epitaxial layer epitaxially formed on the second epitaxial layer. The first epitaxial layer includes at least one selected from the group consisting of a SiAs layer, a SiC layer and a SiCP layer.

20 Claims, 13 Drawing Sheets

(51) Int. Cl.
*H01L 29/786* (2006.01)
*H01L 29/24* (2006.01)

(56) References Cited

U.S. PATENT DOCUMENTS

| | | | | |
|---|---|---|---|---|
| 8,168,556 B2* | 5/2012 | Schulte | .................... | C07F 17/00 |
| | | | | 502/152 |
| 8,785,285 B2* | 7/2014 | Tsai | .................. | H01L 29/66795 |
| | | | | 438/300 |
| 8,962,400 B2 | 2/2015 | Tsai et al. | | |
| 9,093,514 B2 | 7/2015 | Tsai et al. | | |
| 9,236,267 B2 | 1/2016 | De et al. | | |
| 9,245,805 B2 | 1/2016 | Yeh et al. | | |
| 9,418,897 B1 | 8/2016 | Ching et al. | | |
| 9,484,447 B2* | 11/2016 | Kim | .................... | H01L 21/3105 |
| 9,502,265 B1 | 11/2016 | Jiang et al. | | |
| 9,508,712 B2* | 11/2016 | Wahl | .................. | H01L 29/78696 |
| 9,520,466 B2 | 12/2016 | Holland et al. | | |
| 9,520,482 B1 | 12/2016 | Chang et al. | | |
| 9,536,738 B2 | 1/2017 | Huang et al. | | |
| 9,576,814 B2 | 2/2017 | Wu et al. | | |
| 9,608,116 B2* | 3/2017 | Ching | .............. | H01L 21/823481 |
| 9,660,033 B1* | 5/2017 | Chen | .............. | H01L 21/823807 |
| 9,786,774 B2 | 10/2017 | Colinge et al. | | |
| 9,812,363 B1 | 11/2017 | Liao et al. | | |
| 9,818,872 B2* | 11/2017 | Ching | .............. | H01L 29/78696 |
| 9,853,101 B2* | 12/2017 | Peng | .............. | H01L 29/0649 |
| 9,859,380 B2 | 1/2018 | Lee et al. | | |
| 9,881,993 B2* | 1/2018 | Ching | .............. | H01L 21/823418 |
| 9,899,269 B2* | 2/2018 | Ching | .............. | H01L 21/823814 |
| 9,899,387 B2* | 2/2018 | Ching | ................ | H01L 29/1054 |
| 10,008,583 B1 | 6/2018 | Rodder et al. | | |
| 2006/0024874 A1* | 2/2006 | Yun | .................. | H01L 29/66772 |
| | | | | 438/197 |
| 2013/0049080 A1* | 2/2013 | Okano | .............. | H01L 29/66795 |
| | | | | 257/288 |
| 2013/0161756 A1* | 6/2013 | Glass | .................. | H01L 27/1211 |
| | | | | 257/369 |
| 2013/0234203 A1 | 9/2013 | Tsai et al. | | |
| 2013/0234215 A1* | 9/2013 | Okano | .................. | H01L 29/785 |
| | | | | 257/255 |
| 2013/0279145 A1* | 10/2013 | Then | ...................... | H01L 29/205 |
| | | | | 361/820 |
| 2013/0341704 A1* | 12/2013 | Rachmady | ............ | H01L 29/775 |
| | | | | 257/327 |
| 2014/0001441 A1* | 1/2014 | Kim | ........................ | H01L 29/78 |
| | | | | 257/29 |
| 2014/0065782 A1* | 3/2014 | Lu | ...................... | H01L 21/76224 |
| | | | | 438/294 |
| 2014/0091279 A1* | 4/2014 | Kachian | ............ | H01L 29/66439 |
| | | | | 257/27 |
| 2014/0264590 A1* | 9/2014 | Yu | ........................ | H01L 29/6659 |
| | | | | 257/344 |
| 2014/0264592 A1* | 9/2014 | Oxland | ................. | H01L 29/785 |
| | | | | 257/347 |
| 2014/0306297 A1* | 10/2014 | Ching | ............... | H01L 29/66545 |
| | | | | 257/401 |
| 2015/0091099 A1* | 4/2015 | Ching | ............. | H01L 21/823431 |
| | | | | 257/401 |
| 2015/0243733 A1* | 8/2015 | Yang | .................... | H01L 29/0673 |
| | | | | 257/347 |
| 2015/0295089 A1* | 10/2015 | Huang | .............. | H01L 29/66795 |
| | | | | 257/401 |
| 2016/0240652 A1* | 8/2016 | Ching | .............. | H01L 29/42392 |
| 2017/0025314 A1* | 1/2017 | Witters | ............. | H01L 29/66666 |
| 2017/0301554 A1* | 10/2017 | Bi | ...................... | H01L 21/30608 |
| 2017/0330960 A1 | 11/2017 | Bauer et al. | | |
| 2017/0352662 A1 | 12/2017 | Xu | | |
| 2018/0108775 A1* | 4/2018 | More | .................... | H01L 27/092 |
| 2018/0151683 A1* | 5/2018 | Yeo | .................... | H01L 29/0847 |
| 2018/0151717 A1* | 5/2018 | Cheng | .............. | H01L 29/66795 |
| 2018/0175214 A1* | 6/2018 | Chen | .............. | H01L 29/66439 |
| 2019/0064238 A1* | 2/2019 | Peng | ...................... | H01L 22/34 |

\* cited by examiner

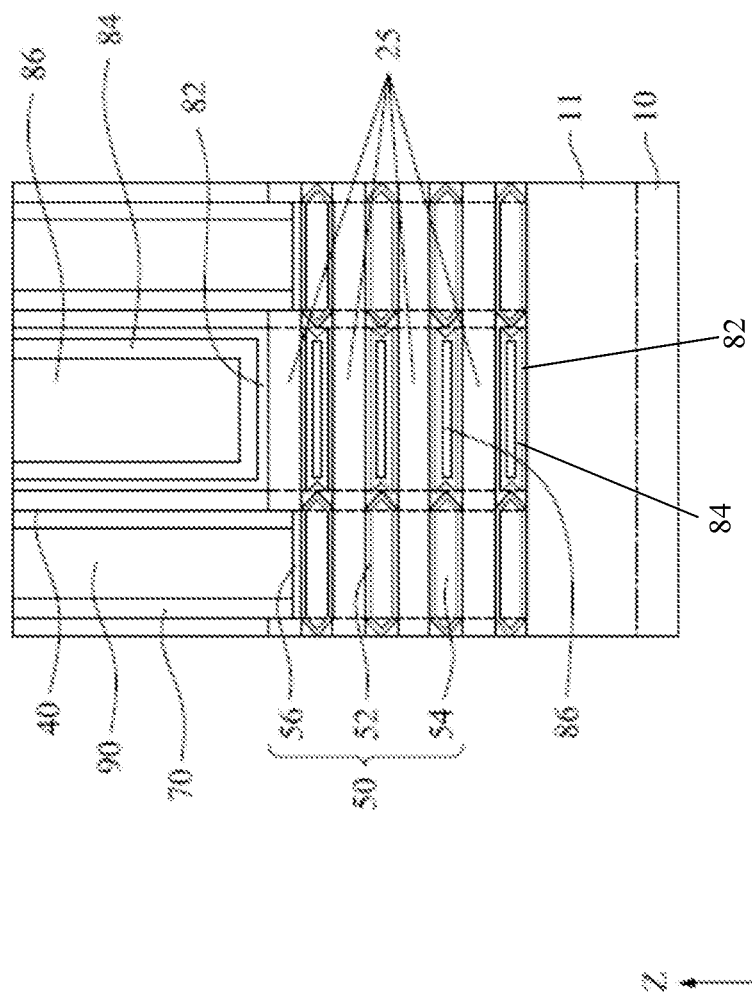

METHOD OF MANUFACTURING A SEMICONDUCTOR DEVICE AND A SEMICONDUCTOR DEVICE

RELATED APPLICATION

This application claims priority to U.S. Provisional Patent Application No. 62/773,092 filed Nov. 29, 2018, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 10A shows one of the various stages of manufacturing a semiconductor FET device according to an embodiment of the present disclosure.

DETAILED DESCRIPTION

Figure 1:
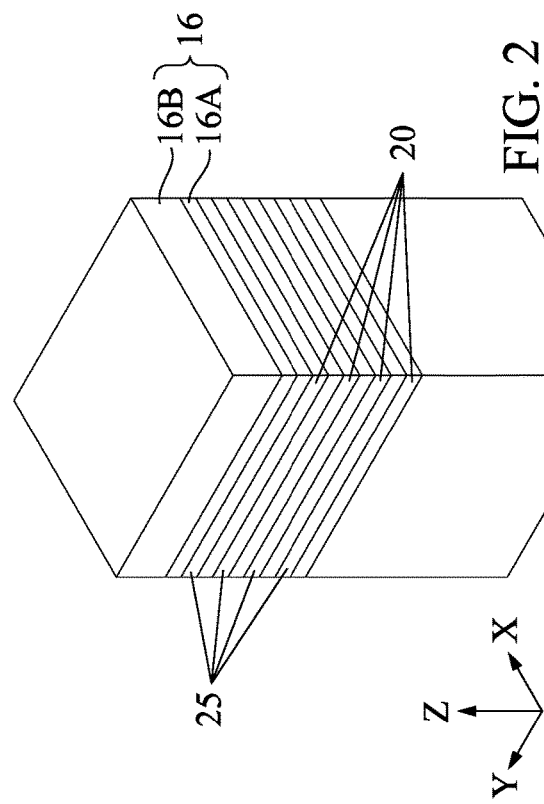
FIG. 1 shows one of the various stages of manufacturing a semiconductor FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In an n-type MOS FET, a SiP (Si with P) source/drain epitaxial layer is used. However, out-diffusion of P from the SiP layer into a channel region will degrade the short channel controllability and limit the gate length scalability. Although it is possible to suppress the P diffusion by using a lower concentration P layer as an initial layer of the SiP layer, it may be insufficient to prevent the P diffusion.

In the present disclosure, one or more of an As containing layer and/or a carbon containing layer, such as SiAs, SiC, SiCAs and SiCP layers, are grown as the first epitaxial layer for a P diffusion barrier layer, which has a lower out-diffusion rate than a lightly P doped SiP layer into the channel region. A high P concentration SiP body layer is then grown on top of the first epitaxial layer. Further, one or more of an As containing layer and/or a carbon containing layer, such as SiAs, SiC, SiCAs and SiCP cap layers are also formed on the SiP body to prevent the P out-gassing during contact metallization.

FIGS. 1-10B show various stages for a sequential manufacturing process of a GAA FET device according to embodiments of the present disclosure. It is understood that in the sequential manufacturing process, one or more additional operations can be provided before, during, and after the stages shown in FIGS. 1-10B, and some of the operations described below can be replaced or eliminated for additional embodiments of the method. The order of the operations/processes may be interchangeable.

FIG. 1 shows one of the various stages of manufacturing a semiconductor FET device according to an embodiment of the present disclosure.

In some embodiments, a substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

As shown in FIG. 1, impurity ions (dopants) 12 are implanted into a silicon substrate 10 to form a well region. The ion implantation is performed to prevent a punch-through effect. The substrate 10 may include various regions that have been suitably doped with impurities (e.g., p-type or n-type conductivity). The dopants 12 are, for example boron ($BF_2$) for an n-type Fin FET and phosphorus for a p-type Fin FET.

Figure 2:
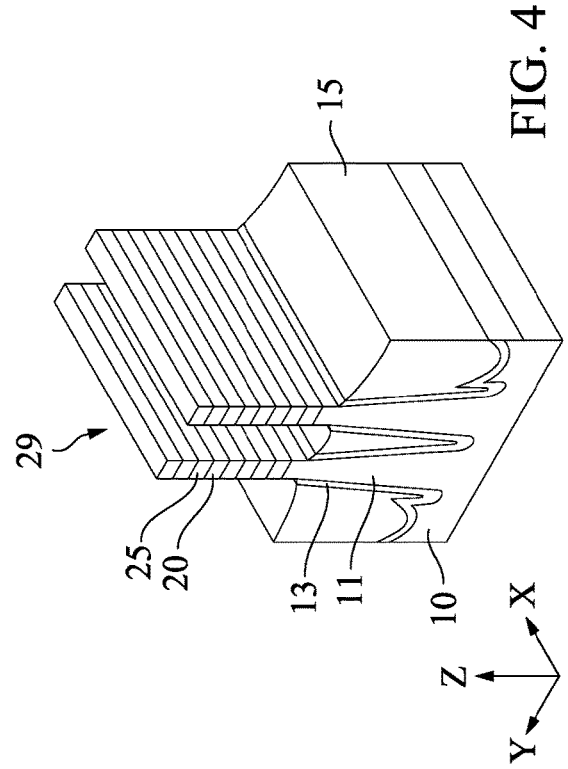
FIG. 2 shows one of the various stages of manufacturing a semiconductor FET device according to an embodiment of the present disclosure.

Then, as shown in FIG. 2, stacked semiconductor layers are formed over the substrate 10. The stacked semiconductor layers include first semiconductor layers 20 and second semiconductor layers 25. Further, a mask layer 16 is formed over the stacked layers.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is more than about 0.3, or Ge (x=1.0) and the second semiconductor layers 25 are Si or $Si_{1-y}Ge_y$, where y is less than about 0.4, and x>y. In this disclosure, an "M" compound" or an "M based compound" means the majority of the compound is M.

In another embodiment, the second semiconductor layers 25 are $Si_{1-y}Ge_y$, where y is more than about 0.3, or Ge, and the first semiconductor layers 20 are Si or $Si_{1-x}Ge_x$, where x is less than about 0.4, and x<y. In yet other embodiments, the first semiconductor layer 20 is made of $Si_{1-x}Ge_x$, where x is in a range from about 0.3 to about 0.8, and the second semiconductor layer 25 is made of $Si_{1-y}Ge_y$, where y is in a range from about 0.1 to about 0.4.

In FIG. 2, four layers of the first semiconductor layer 20 and four layers of the second semiconductor layer 25 are disposed. However, the number of the layers are not limited to four, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 2 nm to about 20 nm in some embodiments, and is in a range from about 5 nm to about 15 nm in other embodiments. The thickness of the second semiconductor layers 25 is in a range from about 2 nm to about 20 nm in some embodiments, and is in a range from about 5 nm to about 15 nm in other embodiments. The thickness of each of the first semiconductor layers 20 may be the same, or may vary.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the mask layer 16 includes a first mask layer 16A and a second mask layer 16B. The first mask layer 16A is a pad oxide layer made of a silicon oxide, which can be formed by a thermal oxidation. The second mask layer 16B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 16 is patterned into a mask pattern by using patterning operations including photo-lithography and etching.

Figure 3:
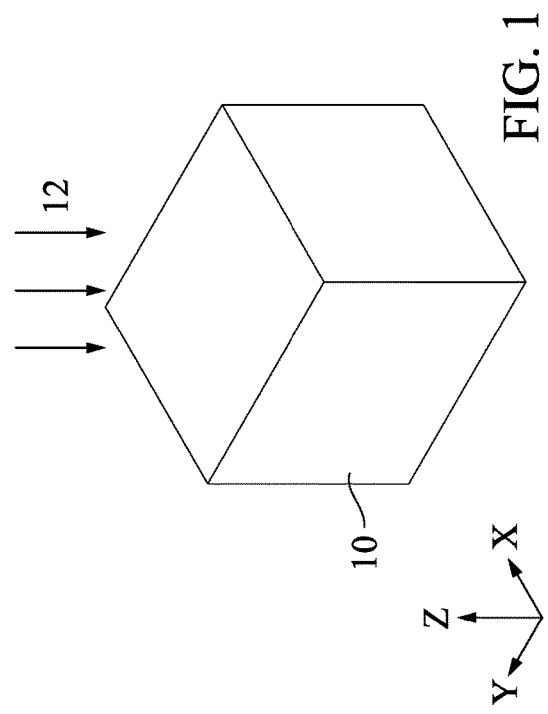
FIG. 3 shows one of the various stages of manufacturing a semiconductor FET device according to an embodiment of the present disclosure.
Figure 4:
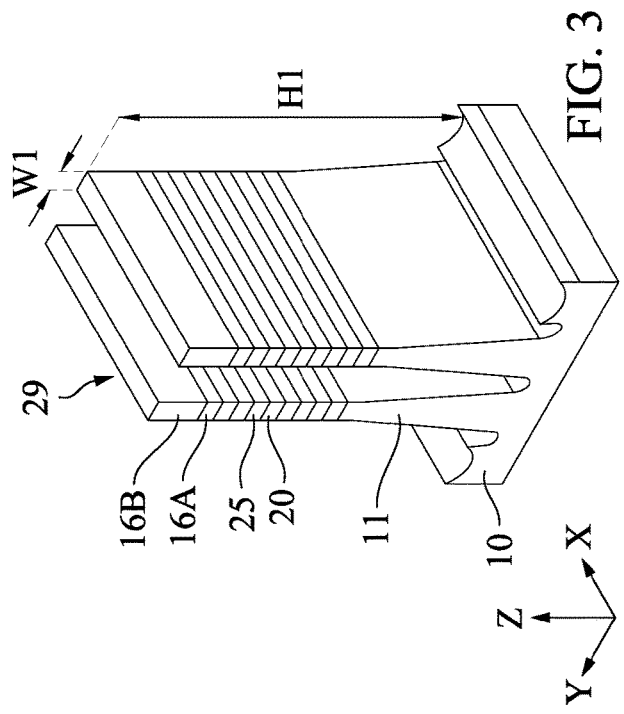
FIG. 4 shows one of the various stages of manufacturing a semiconductor FET device according to an embodiment of the present disclosure.

Next, as shown in FIG. 3, the stacked layers of the first and second semiconductor layers 20, 25 are patterned by using the patterned mask layer 16, thereby the stacked layers are formed into fin structures 29 extending in the X direction. In FIG. 4, two fin structures 29 are arranged in the Y direction. But the number of the fin structures is not limited to two, and may be as small as one and three or more. In some embodiments, one or more dummy fin structures are formed on both sides of the fin structures 29 to improve pattern fidelity in the patterning operations. As shown in FIG. 3 the fin structures 29 have upper portions constituted by the stacked semiconductor layers 20, 25 and well portions 11.

The width W1 of the upper portion of the fin structure along the Y direction is in a range from about 10 nm to about 40 nm in some embodiments, and is in a range from about 20 nm to about 30 nm in other embodiments. The height H1 along the Z direction of the fin structure is in a range from about 100 nm to about 200 nm.

The stacked fin structure 29 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the stacked fin structure 29.

After the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, a fin liner layer 13 is formed over the fin structures before forming the insulating material layer. The fin liner layer 13 is made of SiN or a silicon nitride-based material (e.g., SiON, SiCN or SiOCN).

In some embodiments, the fin liner layers 13 include a first fin liner layer formed over the substrate 10 and sidewalls of the bottom part of the fin structures 11, and a second fin liner layer formed on the first fin liner layer. Each of the liner layers has a thickness between about 1 nm and about 20 nm in some embodiments. In some embodiments, the first fin liner layer includes silicon oxide and has a thickness between about 0.5 nm and about 5 nm, and the second fin liner layer includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

Then, as shown in FIG. 4, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 15 is formed through a process such as CVD, flowable CVD (FCVD), or a spin-on-glass process, although any acceptable process may be utilized.

In the embodiment shown in FIG. 4, the insulating material layer 15 is recessed until the upper portion of the fin structure (well layer) 11 is exposed. In other embodiments, the upper portion of the fin structure 11 is not exposed. The first semiconductor layers 20 are sacrificial layers which are subsequently partially removed, and the second semiconductor layers 25 are subsequently formed into semiconductor wires as channel layers of a GAA FET.

Figure 5:
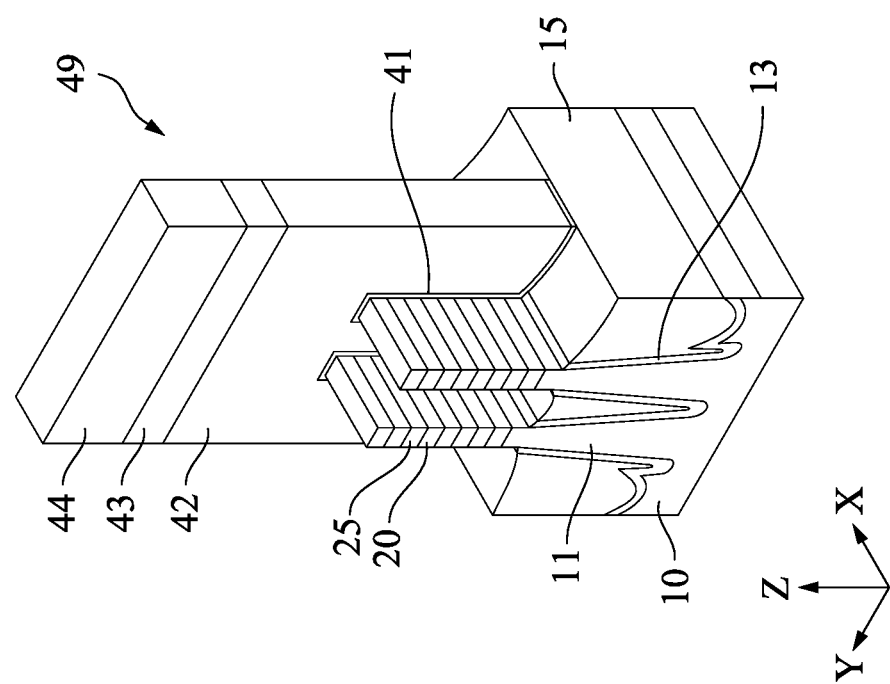
FIG. 5 shows one of the various stages of manufacturing a semiconductor FET device according to an embodiment of the present disclosure.

After the isolation insulating layer 15 is formed, a sacrificial (dummy) gate structure 49 is formed, as shown in FIG. 5. FIG. 5 illustrates a structure after a sacrificial gate structure 49 is formed over the exposed fin structures 29. The sacrificial gate structure 49 is formed over a portion of the fin structures which is to be a channel region. The sacrificial gate structure 49 defines the channel region of the GAA FET. The sacrificial gate structure 49 includes a sacrificial gate dielectric layer 41 and a sacrificial gate electrode layer 42. The sacrificial gate dielectric layer 41 includes one or more layers of insulating material, such as a silicon oxide-based material. In one embodiment, silicon oxide formed by CVD is used. The thickness of the sacrificial gate dielectric layer 41 is in a range from about 1 nm to about 5 nm in some embodiments.

The sacrificial gate structure 49 is formed by first blanket depositing the sacrificial gate dielectric layer 41 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 43 and a silicon oxide mask layer 44.

Next, a patterning operation is performed on the mask layer and sacrificial gate electrode layer is patterned into the sacrificial gate structure 49, as shown in FIG. 5. The sacrificial gate structure includes the sacrificial gate dielectric layer 41, the sacrificial gate electrode layer 42 (e.g., poly silicon), the pad SiN layer 43 and the silicon oxide mask layer 44. By patterning the sacrificial gate structure, the stacked layers of the first and second semiconductor layers are partially exposed on opposite sides of the sacrificial gate structure, thereby defining source/drain (S/D) regions, as shown in FIG. 5. In this disclosure, a source and a drain are interchangeably used and the structures thereof are substantially the same. In FIG. 5, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 6:
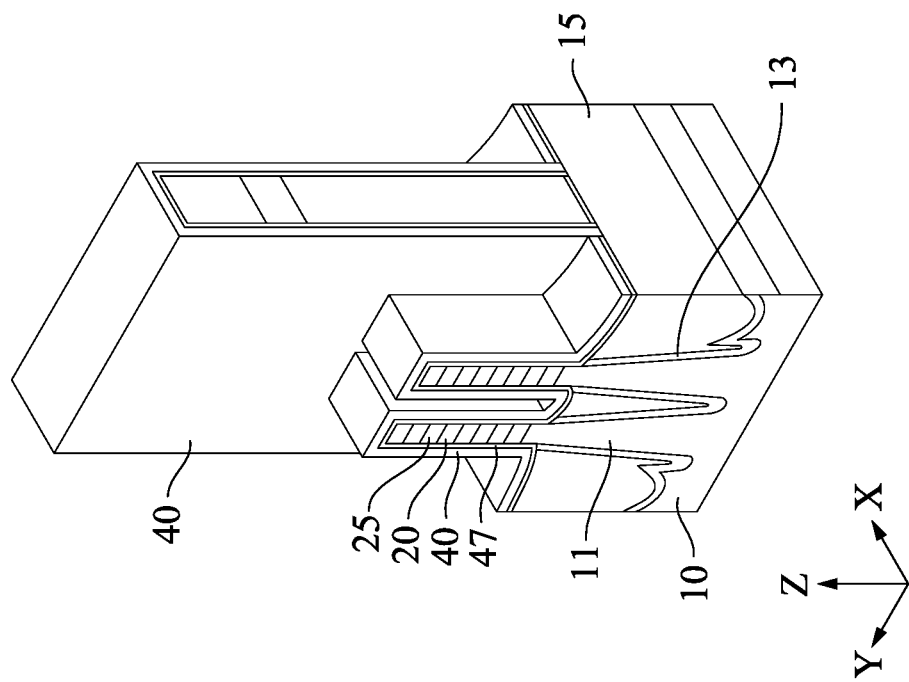
FIG. 6 shows one of the various stages of manufacturing a semiconductor FET device according to an embodiment of the present disclosure.

Further, a cover layer 40 for sidewall spacers is formed over the sacrificial gate structure 49, as shown in FIG. 6. The cover layer 40 is deposited in a conformal manner so that it is formed to have substantially equal thicknesses on vertical surfaces, such as the sidewalls, horizontal surfaces, and the top of the sacrificial gate structure, respectively. In some embodiments, the cover layer 40 has the thickness in a range from about 5 nm to about 20 nm. The cover layer 40 includes one or more of SiN, SiON and SiCN or any other suitable dielectric material. The cover layer 40 can be formed by ALD or CVD, or any other suitable method.

In certain embodiments, before the cover layer 40 is formed, an additional cover layer 47 made of an insulating material is conformally formed over the exposed fin structures and the sacrificial gate structure 49. In such a case, the additional cover layer and the cover layer are made of different materials so that one of them can be selectively etched. The additional cover layer 47 includes a low-k dielectric material, such as SiOC and/or SiOCN or any other suitable dielectric material and can be formed by ALD or CVD, or any other suitable method.

Figure 7A:
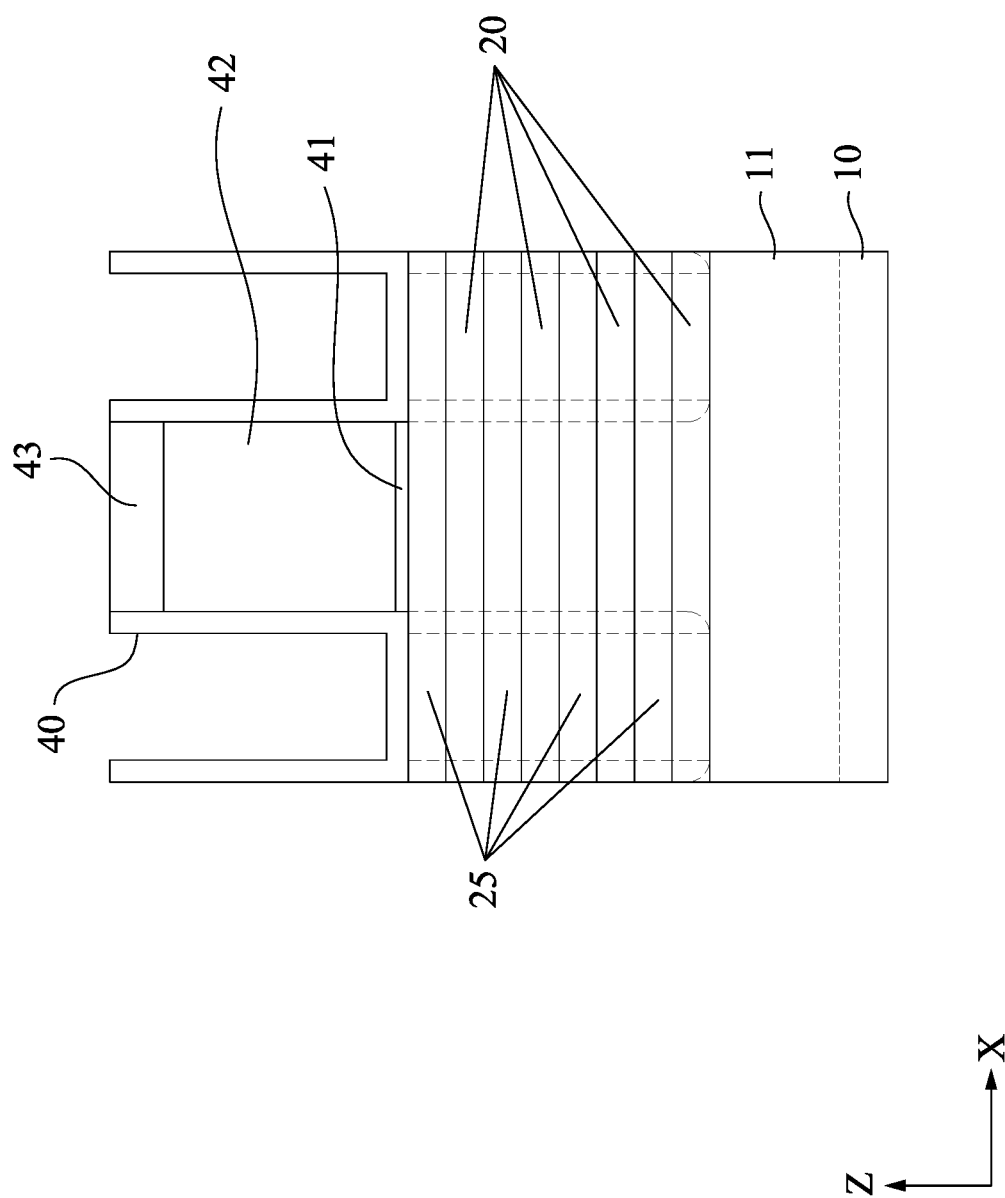
FIGS. 7A and 7B show one of the various stages of manufacturing a semiconductor FET device according to embodiments of the present disclosure.
Figure 7B:
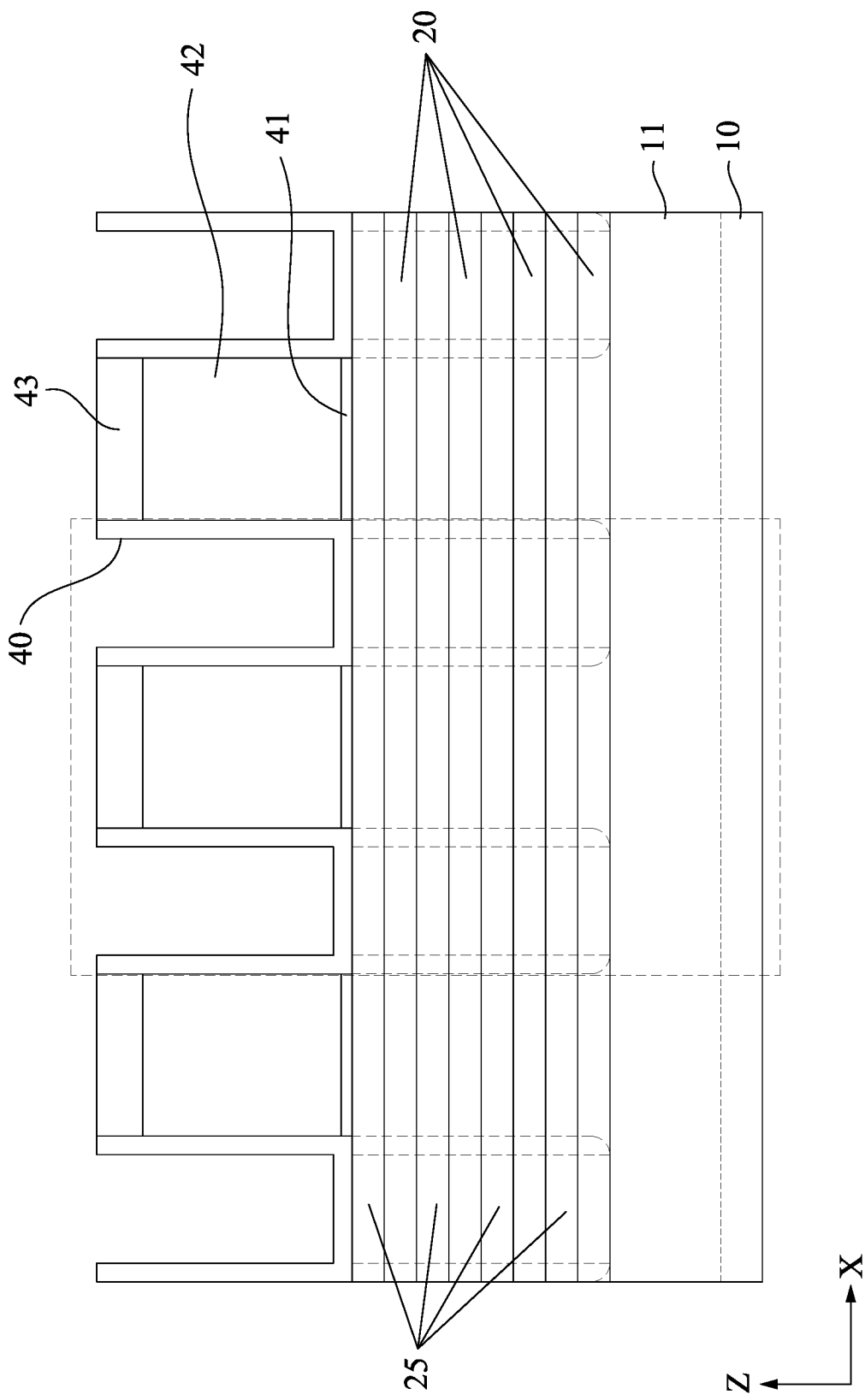

By the operations explained with FIGS. 1-6, the structure of FIG. 7A can be obtained. In some embodiments, one or more additional sacrificial gate structures are formed as shown in FIG. 7B, and semiconductor layers 20 and 25 extend under the additional sacrificial gate structures. In FIGS. 7A and 8-10B, only a part of the structure corresponding the area enclosed by a broken line shown in FIG. 7B is shown, and the additional cover layer 47 is not shown. In addition, in FIGS. 7A-10B, the upper portion of the sacrificial gate structure is not shown.

Figure 8:
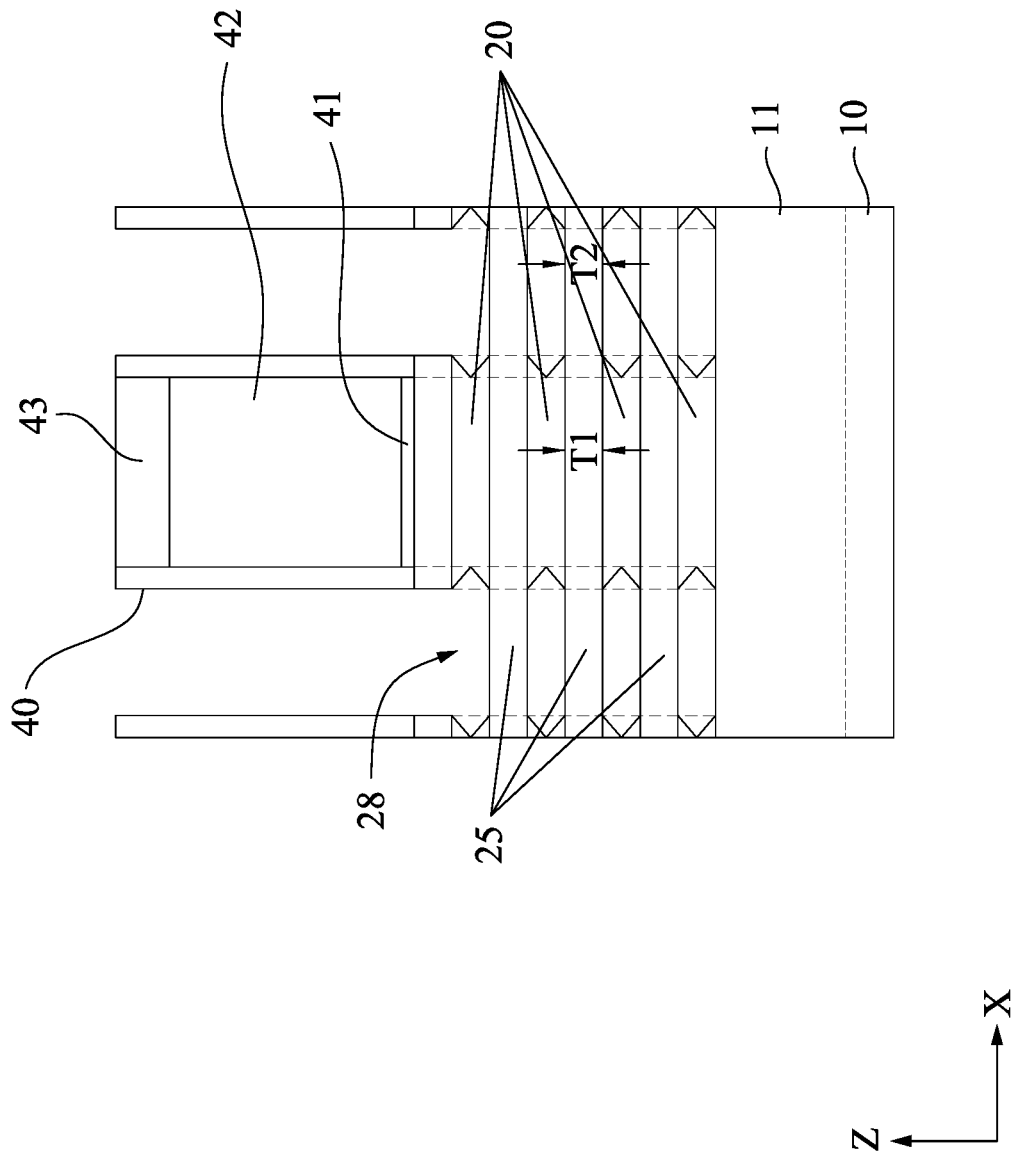
FIG. 8 shows one of the various stages of manufacturing a semiconductor FET device according to an embodiment of the present disclosure.

Next, as shown in FIG. 8, the cover layer 40 formed on the source/drain region is removed by a suitable etching operation, and then a source/drain (S/D) etching operation is performed to selectively remove the first semiconductor layers 20 (SiGe), thereby leaving the second semiconductor layers 25 (Si) in the source/drain region. The etching can be dry etching and/or wet etching. The S/D space 28, in which the second semiconductor layers 25 laterally cross, is formed. In some embodiments, the bottom part of the fin structures 11 (or the substrate 10) is not substantially etched.

In some embodiments, the dimension (e.g., thickness, width, diameter, etc.) of the second semiconductor layers 25 under the sacrificial gate structure is different from that in the source/drain region (S/D space). In some embodiments, a thickness T1 of the second semiconductor layer under the sacrificial gate structure is greater than a thickness T2 of the second semiconductor layer in the S/D space 28. The S/D etching is performed such that the ends of the first semiconductor layers are located below the gate spacer 40 or below the sacrificial gate electrode 42. In some embodiments, the first semiconductor layers 20 are laterally etched in the X direction within the S/D space 28, thereby forming cavities. The amount of etching of the first semiconductor layer 20 is in a range from about 2 nm to about 10 nm in some embodiments. When the first semiconductor layers 20 are Ge or SiGe and the second semiconductor layers 25 are Si, the first semiconductor layers 20 can be selectively etched by using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions.

In some embodiments, by selecting an appropriate crystal orientation of the first semiconductor layers 20 and an etchant, the etched surface of the lateral ends of the first semiconductor layers 20 has a quadrilateral cavity defined by (111) facets, as shown in FIG. 8. In the cross section along the X direction, the cavity has a V-shape (or an open-triangle shape), as shown in FIG. 8.

Figure 9B:
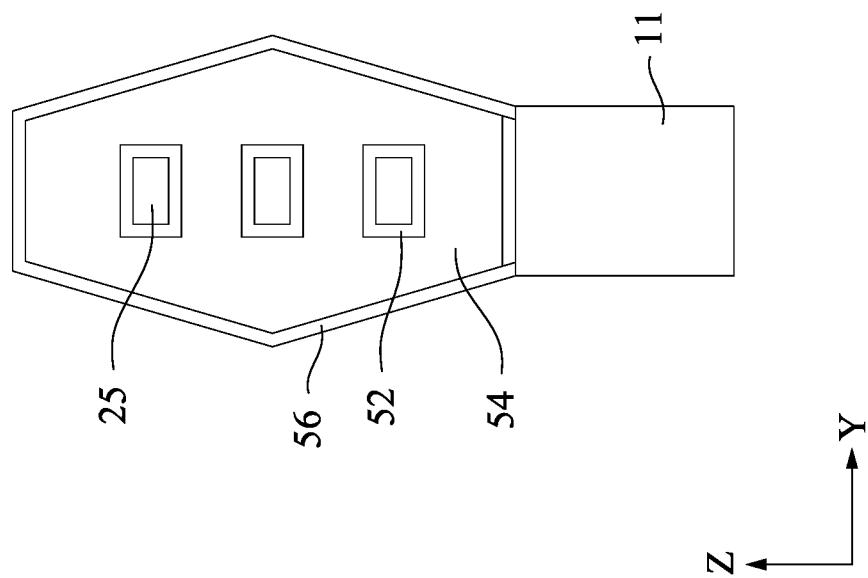
FIGS. 9A and 9B show one of the various stages of manufacturing a semiconductor FET device according to an embodiment of the present disclosure.
Figure 9A:
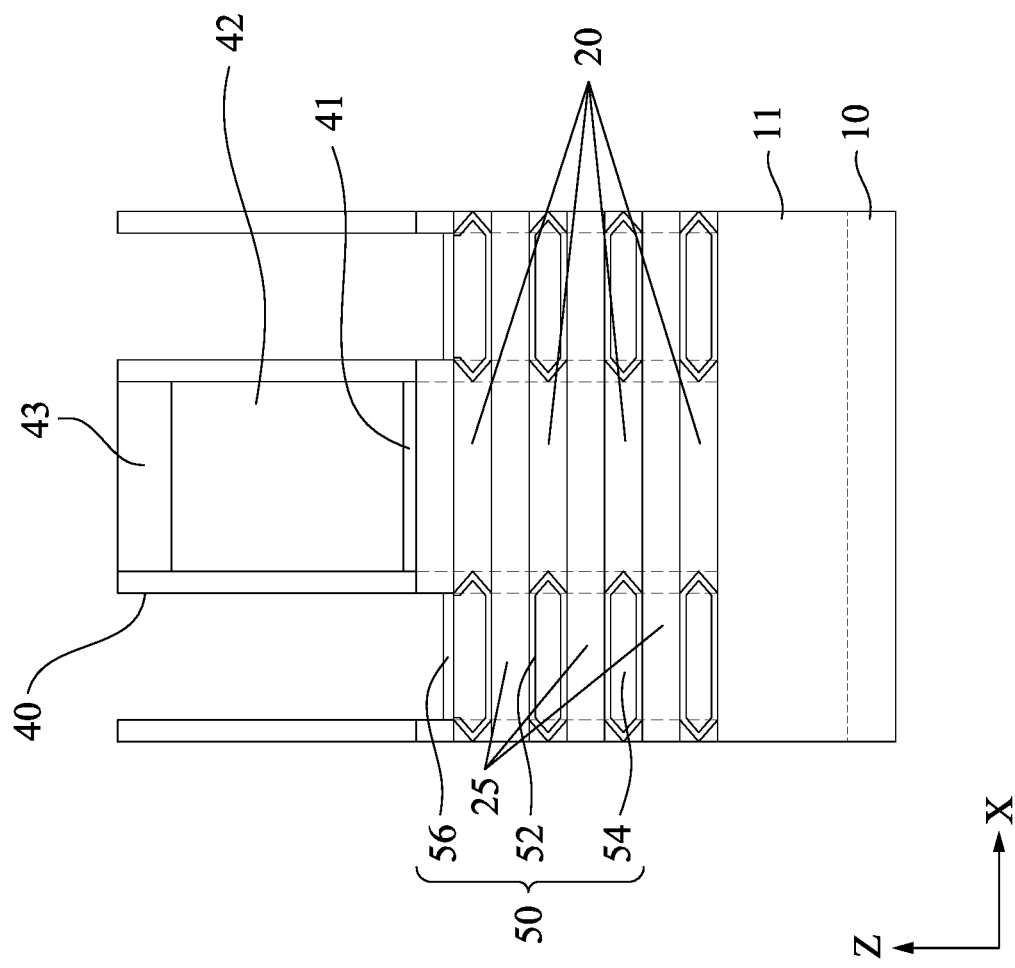

Subsequently, as shown in FIGS. 9A and 9B, an S/D epitaxial layer 50 is formed in the S/D space 28. FIG. 9B is a cross sectional view cutting the S/D epitaxial layer 50 along the Y direction. The source/drain epitaxial layer 50 includes a first epitaxial layer 52 epitaxially formed on the source/drain region of the second semiconductor layers 25, a second epitaxial layer 54 epitaxially formed on the first epitaxial layer 52 and a third epitaxial layer 56 epitaxially formed on the second epitaxial layer 54. In some embodiments, the first epitaxial layer 52 includes at least one selected from the group consisting of a SiAs layer, a SiC layer, SiCAs and a SiCP layer. In some embodiments, the first epitaxial layer 52 includes a single SiAs layer. In other embodiments, the first epitaxial layer 52 is a single SiCAs layer. In some embodiments, the first epitaxial layer 52 is a single SiC layer. In some embodiments, the first epitaxial layer is a single SiCP layer.

In some embodiments, the second epitaxial layer 54 includes a SiP layer.

In some embodiments, the third epitaxial layer 56 includes at least one selected from the group consisting of a SiAs layer, a SiC layer, a SiCAs layer and a SiCP layer. In some embodiments, the third epitaxial layer 56 includes a single SiAs layer. In some embodiments, the third epitaxial layer 56 is a single SiCAs layer. In some embodiments, the third epitaxial layer 56 is a single SiC layer. In some embodiments, the third epitaxial layer 56 is a SiCP layer. In some embodiments, the third epitaxial layer 56 includes a SiP layer having a lower P concentration than the second epitaxial layer 54.

In some embodiments, the second epitaxial layer 54 has a greater thickness than the first epitaxial layer 52 and the third epitaxial layer 56. In some embodiments, a thickness of the first epitaxial layer 52 is in a range from about 0.5 nm to about 5 nm, and is in a range from about 1 nm to about 3 nm in other embodiments. In some embodiments, a thickness of the third epitaxial layer 56 is in a range from about 0.5 nm to about 5 nm, and is in a range from about 1 nm to about 3 nm in other embodiments.

In some embodiments, the first epitaxial layer 52 includes an As containing layer, such as a SiAs layer and a SiCAs layer, and a concentration of As in the SiAs and/or SiCAs layer is in a range from about $1 \times 10^{20}$ atoms/cm$^3$ to about $5 \times 10^{21}$ atoms/cm$^3$. In some embodiments, the second epitaxial layer 54 includes a SiP layer, and a concentration of P in the SiP layer is in a range from about $1 \times 10^{20}$ atoms/cm$^3$ to about $5 \times 10^{21}$ atoms/cm$^3$. In some embodiments, the third epitaxial layer 56 includes an As containing layer, such as a SiAs and SiCAs layer, and a concentration of As in the SiAs and/or SiCAs layer is in a range from about $1 \times 10^{20}$ atoms/cm$^3$ to about $5 \times 10^{21}$ atoms/cm$^3$.

In some embodiments, the first epitaxial layer 52 wraps around the source/drain region of each of the plurality of nanowires (second semiconductor layers 25), and the first epitaxial layer 52 wrapping around one source/drain region is separated from the first epitaxial layer wrapping around an adjacent one source/drain region. In some embodiments, the second epitaxial layer 54 wraps around the source/drain region covered with the first epitaxial layer 52, and fills gaps between adjacent source/drain regions. In some embodiments, the third epitaxial layer 56 covers an outer surface of the second epitaxial layer and is separated from the first epitaxial layer.

In some embodiments, the first epitaxial layer 52 is one or more of SiAs, SiC, SiCAs, and SiCP layers, the second epitaxial layer 54 is a SiP layer, and the third epitaxial layer 56 is one or more of SiAs, SiC, SiCAs, and SiCP layers.

In some embodiments, the first epitaxial layer 52 is one or more of SiAs, SiC, SiCAs, and SiCP layers, the second epitaxial layer 54 is a SiP layer, and the third epitaxial layer 56 is a SiP layer having a different P concentration (e.g., smaller or larger) than the second epitaxial layer 54.

In some embodiments, the first epitaxial layer 52 is one or more of SiAs, SiC, SiCAs, and SiCP layers, the second epitaxial layer 54 is one or more of SiAs, SiC, SiCAs, and SiCP layers, and the third epitaxial layer 56 one or more of SiAs, SiC, SiCAs, and SiCP layers. In some embodiments, concentrations of As, C and/or P are different from the first, second and/or third epitaxial layers. In some embodiments, the first to third epitaxial layers include As, and the concentration of As in the second epitaxial layer is greater than the concentration of As in the first and third epitaxial layers, and the concentration of As in the third epitaxial layer is greater than the concentration of As in the first epitaxial layer.

Figure 10B:
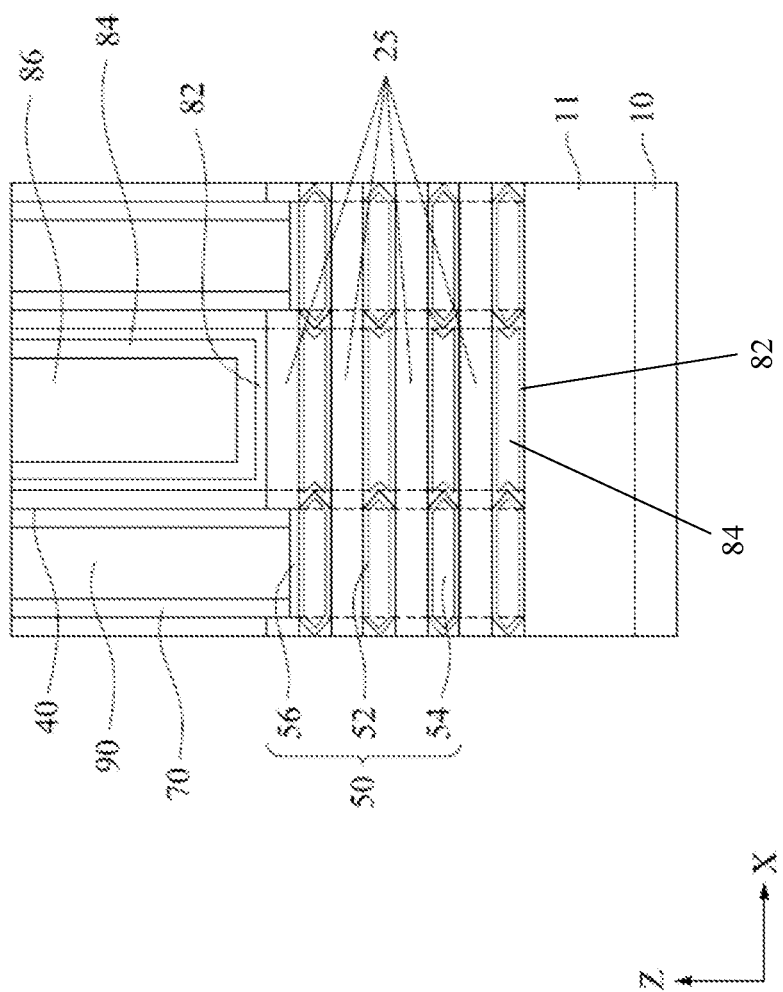
FIG. 10B shows one of the various stages of manufacturing a semiconductor FET device according to another embodiment of the present disclosure.

After the S/D epitaxial layer 50 is formed, an interlayer dielectric (ILD) layer 70 is formed over the S/D epitaxial layer 50, as shown in FIGS. 10A and 10B. The materials for the ILD layer 70 include compounds comprising Si, 0, C and/or H, such as silicon oxide, SiCOH and SiOC. Organic materials, such as polymers, may be used for the ILD layer. After the ILD layer is formed, a planarization operation, such as CMP, is performed, so that the top portion of the sacrificial gate electrode layer 42 is exposed.

Then, the sacrificial gate electrode layer 42 and sacrificial gate dielectric layer 41 are removed. The ILD layer 70 protects the S/D epitaxial layer 50 during the removal of the sacrificial gate structures. The sacrificial gate structures can be removed using plasma dry etching and/or wet etching. When the sacrificial gate electrode layer 42 is polysilicon and the ILD layer is silicon oxide, a wet etchant such as a TMAH solution can be used to selectively remove the sacrificial gate electrode layer 42. The sacrificial gate dielectric layer 41 is thereafter removed using plasma dry etching and/or wet etching.

After the sacrificial gate structures are removed, the first semiconductor layers 20 are removed in the channel region, thereby forming wires of the second semiconductor layers 25. After the semiconductor wires of the second semiconductor layers 25 are formed, a gate dielectric layer 82 is formed around each channel layers (wires of the second semiconductor layers 25), and a gate electrode layer 86 is formed on the gate dielectric layer, as shown in FIGS. 10A and 10B.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer includes an interfacial layer (not shown) formed between the channel layers and the dielectric material.

The gate dielectric layer 82 may be formed by CVD, ALD or any suitable method. In one embodiment, the gate dielectric layer is formed using a highly conformal deposition process such as ALD in order to ensure the formation of a gate dielectric layer having a uniform thickness around each channel layers. The thickness of the gate dielectric layer is in a range from about 1 nm to about 6 nm in one embodiment.

The gate electrode layer 86 is formed on the gate dielectric layer to surround each channel layer. The gate electrode includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 86 may be formed by CVD, ALD, electro-plating, or other suitable method. The gate electrode layer is also deposited over the upper surface of the ILD layer 70. The gate dielectric layer and the gate electrode layer formed over the ILD layer 70 are then planarized by using, for example, CMP, until the top surface of the ILD layer 70 is revealed. In some embodiments, after the planarization operation, the gate electrode layer is recessed and a cap insulating layer (not shown) is formed over the recessed gate electrode. The cap insulating layer includes one or more layers of a silicon nitride-based material, such as SiN. The cap insulating layer can be formed by depositing an insulating material followed by a planarization operation.

In certain embodiments of the present disclosure, one or more work function adjustment layers 84 are interposed between the gate dielectric layer and the gate electrode. The work function adjustment layer 84 is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer 84 may be formed separately for the n-channel FET and the p-channel FET which may use different metal layers. In some embodiments, the gate electrode layer 86 is also formed between the second semiconductor layers 25 as shown in FIG. 10A. In other embodiments, as shown in FIG. 10B, spaces between the second semiconductor layers 25 are fully filled by the gate dielectric layer 82 and the work function adjustment layer 84.

Subsequently, contact holes are formed in the ILD layer 70 by using dry etching, thereby exposing the upper portion of the S/D epitaxial layer 50. In some embodiments, a silicide layer knot shown) is formed over the S/D epitaxial layer 50. The silicide layer includes one or more of WSi, CoSi, NiSi, TiSi, MoSi and TaSi, in some embodiments. Then, a conductive contact layer 90 is formed in the contact holes, as shown in FIGS. 10A and 10B. The conductive contact layer includes one or more of Co, Ni, W, Ti, Ta, Cu, Al, TiN and TaN, in some embodiments. Further, a conductive contact plug is formed on the conductive contact layer in some embodiments. The conductive contact plug includes one or more layers of Co, Ni, W, Ti, Ta, Cu, Al, TiN and TaN, in some embodiments.

It is understood that the GAA FETs undergo further CMOS processes to form various features such as contacts/vias, interconnect metal layers, dielectric layers, passivation layers, etc.

Figure 11:
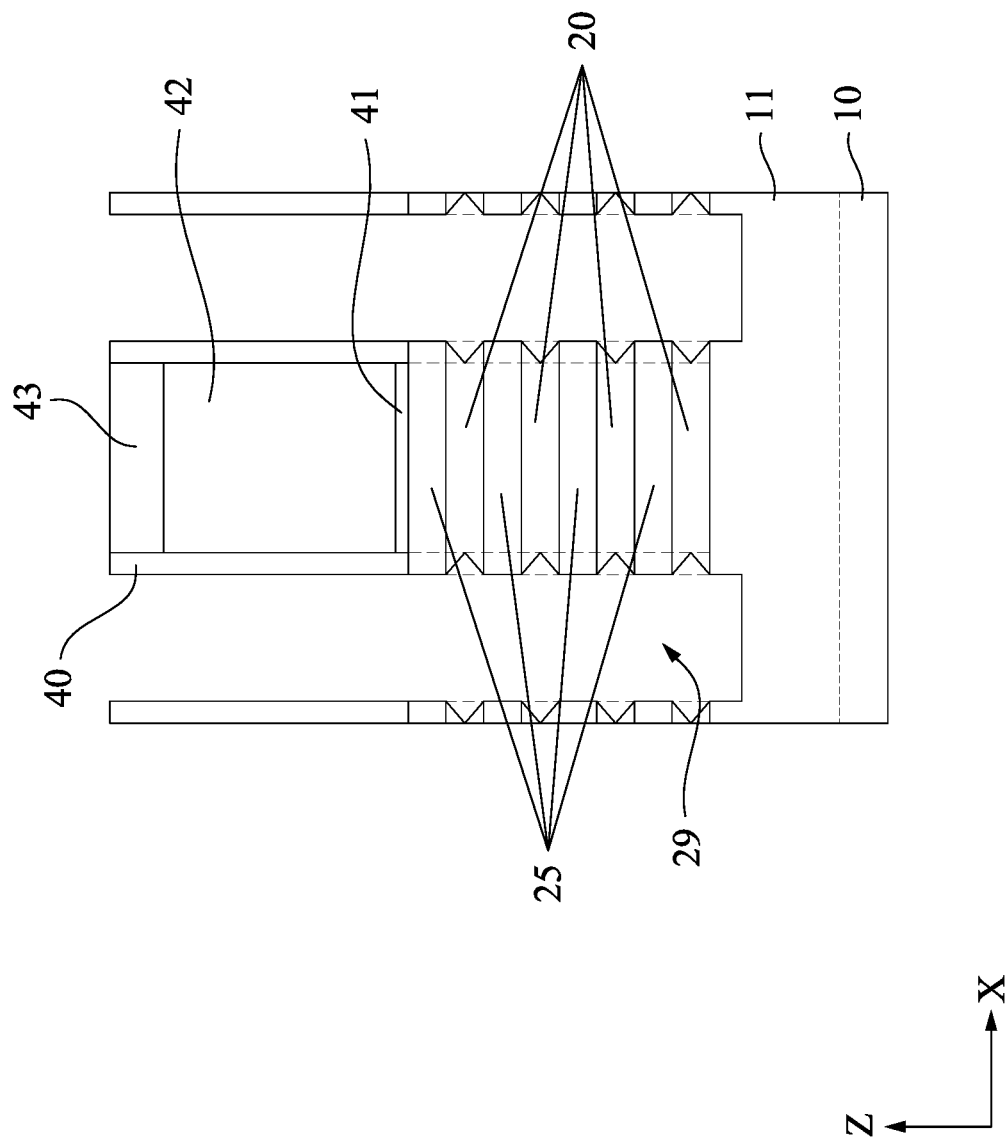
FIG. 11 shows one of the various stages of manufacturing a semiconductor FET device according to another embodiment of the present disclosure.
Figure 12B:
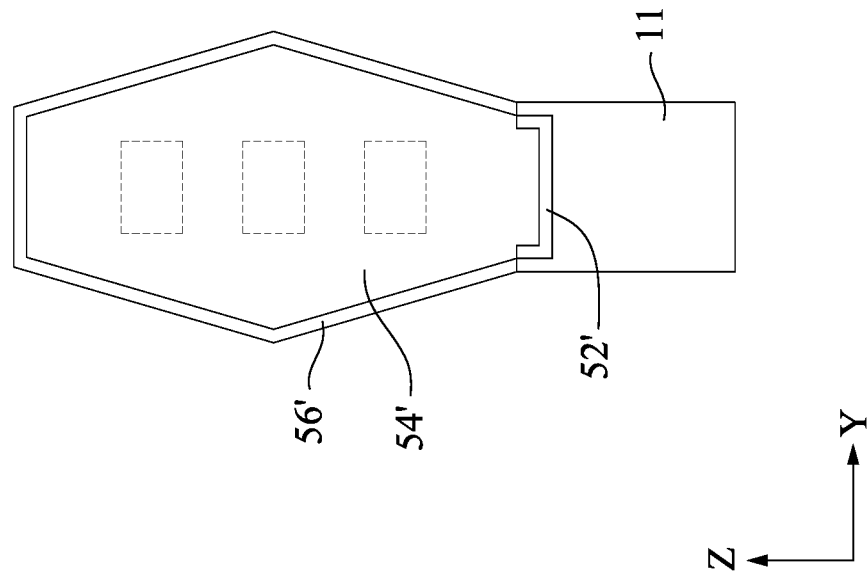
FIGS. 12A and 12B show one of the various stages of manufacturing a semiconductor FET device according to another embodiment of the present disclosure.
Figure 12A:
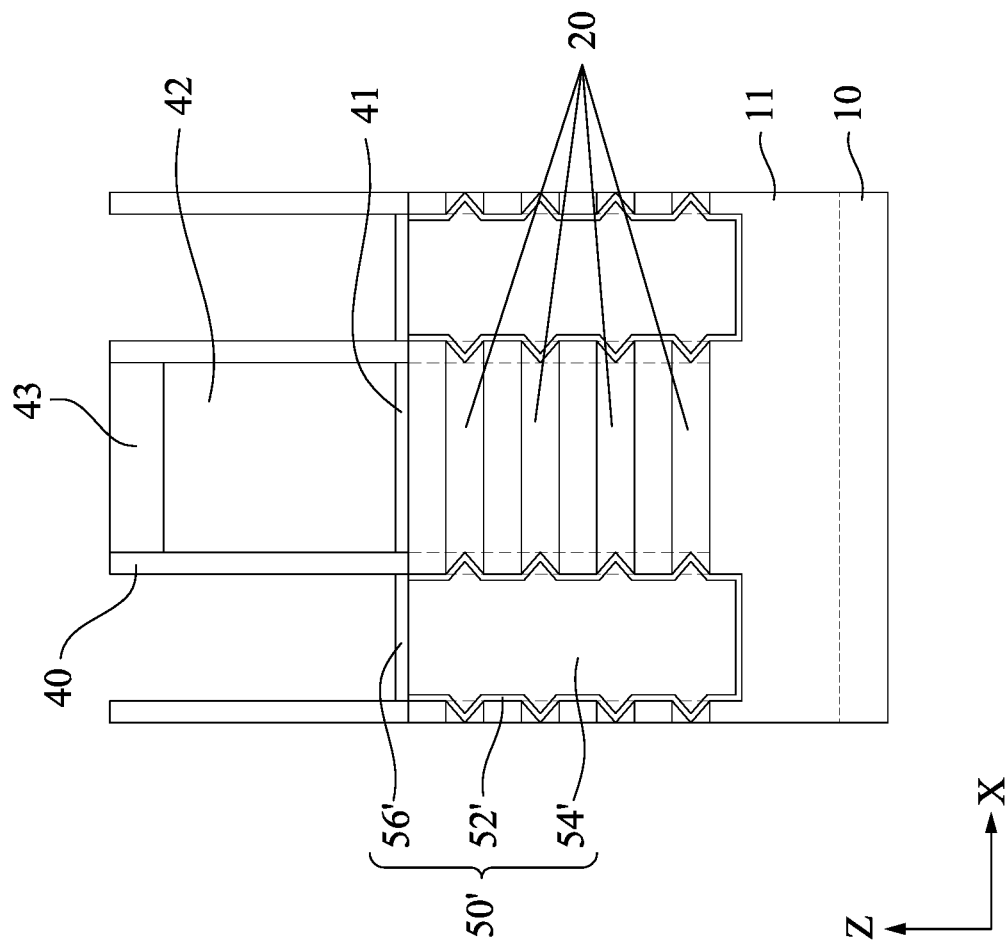
Figure 13:
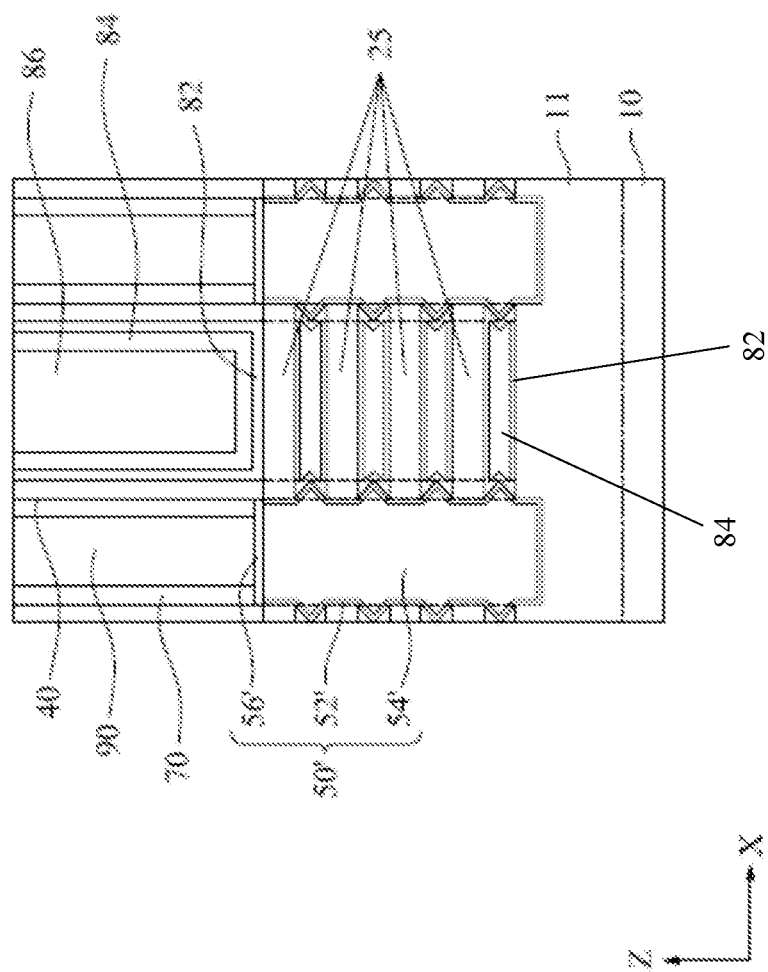
FIG. 13 shows one of the various stages of manufacturing a semiconductor FET device according to another embodiment of the present disclosure.

FIGS. 11-13 show various stages for a sequential manufacturing process of a GAA FET device according to embodiments of the present disclosure. It is understood that in the sequential manufacturing process, one or more additional operations can be provided before, during, and after the stages shown in FIGS. 11-13, and some of the operations described below can be replaced or eliminated for additional embodiments of the method. The order of the operations/processes may be interchangeable. Materials, configurations, dimensions, processes and/or operations described with respect to FIGS. 1-10B may be employed in the following embodiments, and detailed explanation thereof may be omitted.

After the structure shown in FIG. 7 is formed, an S/D etching operation is performed. In this embodiment, the S/D etching operation is performed to remove both the first semiconductor layers 20 and the second semiconductor layers 25 in the source/drain region, to form an S/D space 29. In some embodiments, an upper portion of the bottom part of the fin structures 11 (or the substrate 10) is also etched.

Subsequently, as shown in FIGS. 12A and 12B, an S/D epitaxial layer 50' is formed in the S/D space 29. FIG. 12B is a cross sectional view cutting the S/D epitaxial layer 50' along the Y direction. The source/drain epitaxial layer 50' includes a first epitaxial layer 52' epitaxially formed on the source/drain region, a second epitaxial layer 54' epitaxially formed on the first epitaxial layer 52' and a third epitaxial layer 56' epitaxially formed on the second epitaxial layer 54'. In some embodiments, the first epitaxial layer 52' includes at least one selected from the group consisting of a SiAs layer, a SiC layer, SiCAs and a SiCP layer. In some embodiments, the first epitaxial layer 52' includes a single SiAs layer. In other embodiments, the first epitaxial layer 52' is a single SiCAs layer. In some embodiments, the first epitaxial layer 52' is a single SiC layer. In some embodiments, the first epitaxial layer is a single SiCP layer.

In some embodiments, the second epitaxial layer 54' includes a SiP layer.

In some embodiments, the third epitaxial layer 56' includes at least one selected from the group consisting of a SiAs layer, a SiC layer, a SiCAs layer and a SiCP layer. In some embodiments, the third epitaxial layer 56' includes a single SiAs layer. In some embodiments, the third epitaxial layer 56' is a single SiCAs layer. In some embodiments, the third epitaxial layer 56' is a single SiC layer. In some embodiments, the third epitaxial layer 56' is a SiCP layer. In some embodiments, the third epitaxial layer 56' includes a SiP layer having a lower P concentration than the second epitaxial layer 54'.

In some embodiments, the second epitaxial layer 54' has a greater thickness than the first epitaxial layer 52' and the third epitaxial layer 56'. In some embodiments, a thickness of the first epitaxial layer 52' is in a range from about 0.5 nm to about 5 nm, and is in a range from about 1 nm to about 3 nm in other embodiments. In some embodiments, a thickness of the third epitaxial layer 56' is in a range from about 0.5 nm to about 5 nm, and is in a range from about 1 nm to about 3 nm in other embodiments.

In some embodiments, the first epitaxial layer 52' includes an As containing layer, such as a SiAs layer and a SiCAs layer, and a concentration of As in the SiAs and/or SiCAs layer is in a range from about $1\times10^{20}$ atoms/cm$^3$ to about $5\times10^{21}$ atoms/cm$^3$. In some embodiments, the second epitaxial layer 54' includes a SiP layer, and a concentration of P in the SiP layer is in a range from about $1\times10^{20}$ atoms/cm$^3$ to about $5\times10^{21}$ atoms/cm$^3$. In some embodiments, the third epitaxial layer 56' includes an As containing layer, such as a SiAs and SiCAs layer, and a concentration of As in the SiAs and/or SiCAs layer is in a range from about $1\times10^{20}$ atoms/cm$^3$ to about $5\times10^{21}$ atoms/cm$^3$. When the concentrations of As, P and/or C are within these ranges, it is possible to effectively suppress P diffusion while maintaining appropriate stress and low source/drain resistance.

In some embodiments, the first epitaxial layer 52' is one or more of SiAs, SiC, SiCAs, and SiCP layers, the second epitaxial layer 54' is a SiP layer, and the third epitaxial layer 56' is one or more of SiAs, SiC, SiCAs, and SiCP layers.

In some embodiments, the first epitaxial layer 52' is one or more of SiAs, SiC, SiCAs, and SiCP layers, the second epitaxial layer 54' is a SiP layer, and the third epitaxial layer 56' is a SiP layer having different P concentration (e.g., smaller or larger) than the second epitaxial layer 54'.

In some embodiments, the first epitaxial layer 52' is one or more of SiAs, SiC, SiCAs, and SiCP layers, the second epitaxial layer 54' is one or more of SiAs, SiC, SiCAs, and SiCP layers, and the third epitaxial layer 56' one or more of SiAs, SiC, SiCAs, and SiCP layers. In some embodiments, concentrations of As, C and/or P are different from the first, second and/or third epitaxial layers. In some embodiments, the first to third epitaxial layers includes As, and the concentration of As in the second epitaxial layer is greater than the concentration of As in the first and third epitaxial layers, and the concentration of As in the third epitaxial layer is greater than the concentration of As in the first epitaxial layer.

Subsequently, an interlayer dielectric (ILD) layer 70 is formed over the S/D epitaxial layer 50'. Then, the sacrificial gate electrode layer 42 and sacrificial gate dielectric layer 41 are removed. After the sacrificial gate structures are removed, the first semiconductor layers 20 are removed in the channel region, thereby forming wires of the second semiconductor layers 25. After the semiconductor wires of the second semiconductor layers 25 are formed, a gate dielectric layer 82 is formed around each channel layers (wires of the second semiconductor layers 25), a work function adjustment layer 84 and a gate electrode layer 86 is formed on the gate dielectric layer, as shown in FIG. 13. Subsequently, a conductive contact layer 90 is formed in the contact holes, as shown in FIG. 13.

It is understood that the GAA FETs undergo further CMOS processes to form various features such as contacts/vias, interconnect metal layers, dielectric layers, passivation layers, etc.

Figure 14:
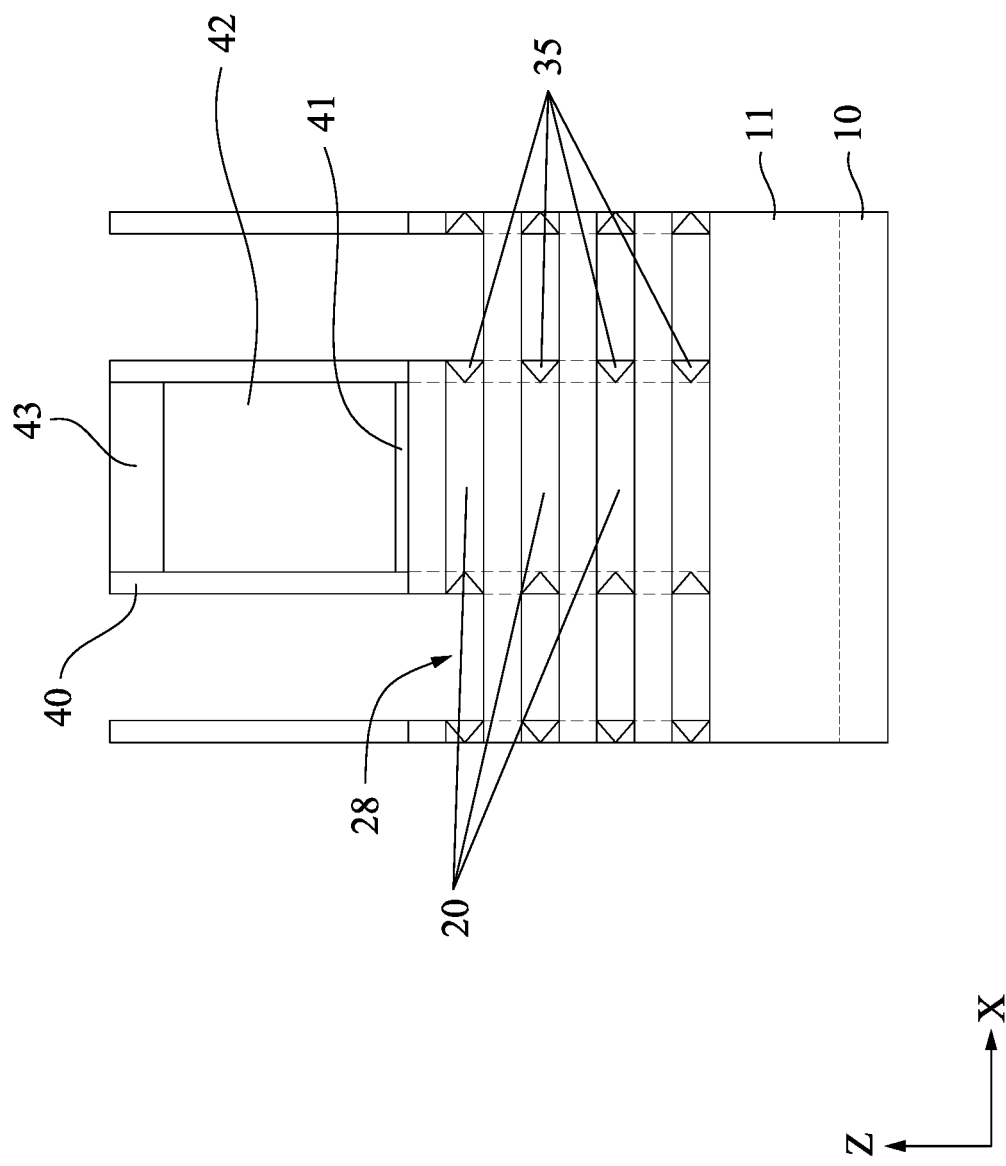
FIG. 14 shows one of the various stages of manufacturing a semiconductor FET device according to another embodiment of the present disclosure.
Figure 15:
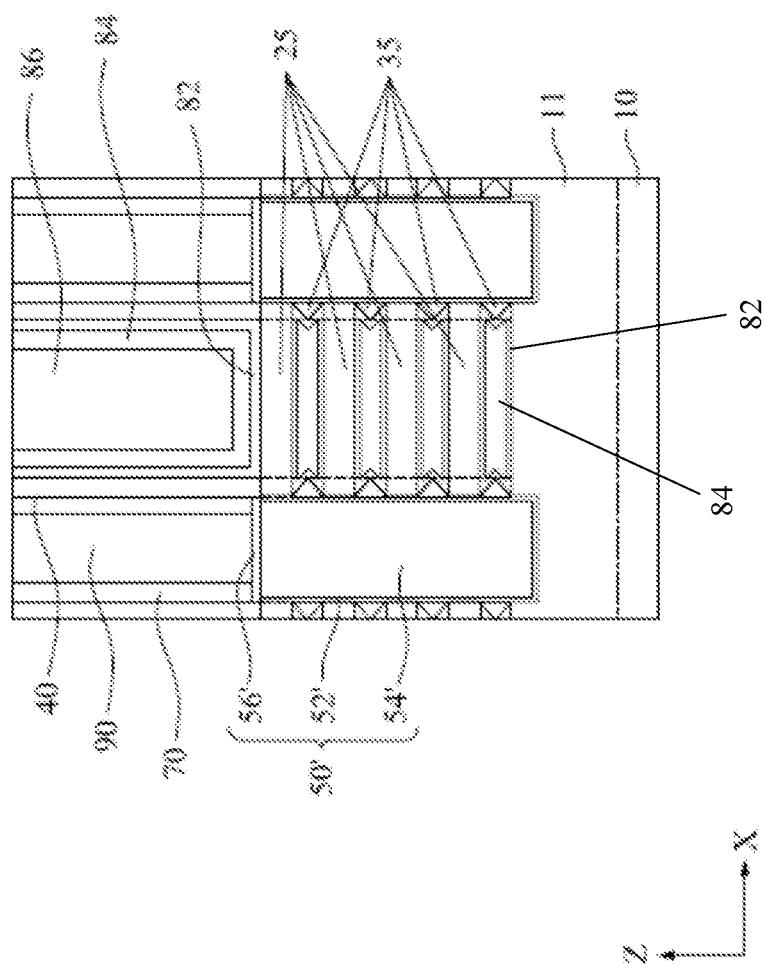
FIG. 15 shows one of the various stages of manufacturing a semiconductor FET device according to another embodiment of the present disclosure.

FIGS. 14 and 15 show various stages for a sequential manufacturing process of a GAA FET device according to embodiments of the present disclosure. It is understood that in the sequential manufacturing process, one or more additional operations can be provided before, during, and after the stages shown in FIGS. 14 and 15, and some of the operations described below can be replaced or eliminated for additional embodiments of the method. The order of the operations/processes may be interchangeable. Materials, configurations, dimensions, processes and/or operations described with respect to FIGS. 1-13 may be employed in the following embodiments, and detailed explanation thereof may be omitted.

After the first semiconductor layers 20 are selectively removed as shown in FIG. 8, inner spacers 35 are formed at ends of the first semiconductor layer 20, as shown in FIG. 14. The inner spacers 14 are made of insulating material, such as silicon oxide, silicon nitride, silicon oxynitride (SiON), SiOCN, SiOC or SiCN, or any other suitable insulating material. In some embodiments, one or more insulating material layers for the inner spacers 35 are conformally formed in the source/drain space 28, and then etching operation is performed to remove unnecessary portion of the insulating material layers, thereby leaving the inner spacers 35 at the end faces of the first semiconductor layer 20. Subsequently, the operations explained with respect to FIGS. 9A, 9B and 10 are performed, and the structure shown in FIG. 15 is obtained.

It will be understood that not all advantages have been necessarily discussed herein, no particular advantage is required for all embodiments or examples, and other embodiments or examples may offer different advantages.

For example, in the present disclosure, since one or more of SiAs, SiC, SiCAs and SiCP layers are grown as the first epitaxial layer, it is possible to present out-diffusion of P from the SiP body layer into the channel region. Further, it is possible to form a higher P concentration SiP body layer to reduce resistivity. Moreover, since one or more of SiAs, SiC, SiCAs and SiCP cap layers are also formed on the SiP body, it is also possible to prevent the P out-gassing during contact metallization.

In accordance with one aspect of the present disclosure, a semiconductor device includes a channel region, a source/drain region adjacent to the channel region, and a source/drain epitaxial layer. The source/drain epitaxial layer includes a first epitaxial layer epitaxially formed on the source/drain region, a second epitaxial layer epitaxially formed on the first epitaxial layer and a third epitaxial layer epitaxially formed on the second epitaxial layer. The first epitaxial layer includes at least one selected from the group consisting of a SiAs layer, a SiC layer and a SiCP layer. In one or more of the foregoing and the following embodiments, the first epitaxial layer includes one of a SiAs layer, a SiC layer and a SiCAd layer. In one or more of the foregoing and the following embodiments, the first epitaxial layer is a SiAs layer. In one or more of the foregoing and the following embodiments, the first epitaxial layer is a SiC layer. In one or more of the foregoing and the following embodiments, the first epitaxial layer is a SiCAs layer. In one or more of the foregoing and the following embodiments, the second epitaxial layer includes a SiP layer. In one or more of the foregoing and the following embodiments, the third epitaxial layer includes at least one selected from the group consisting of a SiAs layer, a SiC layer, a SiCAs layer and a SiCP layer. In one or more of the foregoing and the following embodiments, the third epitaxial layer includes one of a SiAs layer, a SiC layer and a SiCAs layer. In one or more of the foregoing and the following embodiments, the third epitaxial layer is a SiAs layer. In one or more of the foregoing and the following embodiments, the third epitaxial layer is a SiC layer. In one or more of the foregoing and the following embodiments, the third epitaxial layer is a SiCAs layer. In one or more of the foregoing and the following embodiments, the third epitaxial layer includes a SiP layer having a lower P concentration than the second epitaxial layer. In one or more of the foregoing and the following embodiments, the second epitaxial layer has a greater thickness than the first epitaxial layer and the third epitaxial layer. In one or more of the foregoing and the following embodiments, a thickness of the first epitaxial layer is in a range from 1 nm to 3 nm. In one or more of the foregoing and the following embodiments, a thickness of the third epitaxial layer is in a range from 1 nm to 3 nm. In one or more of the foregoing and the following embodiments, the first epitaxial layer includes a SiAs layer and/or a SiCAs layer, and a concentration of As in the first epitaxial layer is in a range from $1 \times 10^{20}$ atoms/cm$^3$ to $5 \times 10^{21}$ atoms/cm$^3$. In one or more of the foregoing and the following embodiments, the second epitaxial layer includes a SiP layer, and a concentration of P in the SiP layer is in a range from $1 \times 10^{20}$ atoms/cm$^3$ to $5 \times 10^{21}$ atoms/cm$^3$. In one or more of the foregoing and the following embodiments, the third epitaxial layer includes a SiAs layer and/or a SiCAs layer, and a concentration of As in the third epitaxial layer is in a range from $1 \times 10^{20}$ atoms/cm$^3$ to $5 \times 10^{21}$ atoms/cm$^3$. In one or more of the foregoing and the following embodiments, the semiconductor device is a gate-all-around field effect transistor comprising a plurality of nanowires vertically arranged over a bottom fin structure, and each of the plurality of nanowires has the channel region and the source/drain region. In one or more of the foregoing and the following embodiments, the first epitaxial layer wraps around the source/drain region of each of the plurality of nanowires, and the first epitaxial layer wrapping around one source/drain region is separated from the first epitaxial layer wrapping around adjacent one source/drain region. In one or more of the foregoing and the following embodiments, the second epitaxial layer wraps around the source/drain region covered with the first epitaxial layer, and fills gaps between adjacent source/drain regions. In one or more of the foregoing and the following embodiments, the third epitaxial layer covers an outer surface of the second epitaxial layer and is separated from the first epitaxial layer.

In accordance with another aspect of the present disclosure, a semiconductor device includes a gate-all-around field effect transistor (GAA FET). The GAA FET includes a plurality of semiconductor nanowires each having a channel region and a source/drain region adjacent to the channel region, and a source/drain epitaxial layer. The source/drain epitaxial layer includes a first epitaxial layer epitaxially wrapping around on the source/drain region of each of the semiconductor nanowires, a second epitaxial layer epitaxially formed on the first epitaxial layer and a third epitaxial layer epitaxially formed on the second epitaxial layer. The second epitaxial layer includes P. The first epitaxial layer includes a material that suppresses P diffusion from the second epitaxial layer to the source/drain region. In one or more of the foregoing and the following embodiments, the third epitaxial layer includes a material that suppresses P diffusion from the second epitaxial layer. In one or more of the foregoing and the following embodiments, the first epitaxial layer and the third epitaxial layer contain As, and a concentration of As in the first epitaxial layer is smaller than a concentration of As in the third epitaxial layer.

In accordance with another aspect of the present disclosure, a semiconductor device includes a gate-all-around field effect transistor (GAA FET). The GAA FET includes a plurality of semiconductor nanowires each having a channel region and a source/drain region adjacent to the channel region, and a source/drain epitaxial layer. The source/drain epitaxial layer includes a first epitaxial layer epitaxially wrapping around the source/drain region of each of the semiconductor nanowires, a second epitaxial layer epitaxially formed on the first epitaxial layer and a third epitaxial layer epitaxially formed on the second epitaxial layer. The first epitaxial layer includes at least one selected from the group consisting of a semiconductor material containing As and a semiconductor material containing C.

In accordance with another aspect of the present disclosure, in a method of manufacturing a semiconductor device, a first epitaxial layer is formed over a source/drain region, a second epitaxial layer is formed over the first epitaxial layer and a third epitaxial layer is formed over the second epitaxial layer. The first epitaxial layer includes at least one selected from the group consisting of a SiAs layer, a SiC layer, a SiCAs layer and a SiCP layer. In one or more of the foregoing and the following embodiments, the first epitaxial layer includes one of a SiAs layer, a SiC layer and a SiCAs layer. In one or more of the foregoing and the following embodiments, the first epitaxial layer is a SiAs layer. In one or more of the foregoing and the following embodiments, the first epitaxial layer is a SiC layer. In one or more of the foregoing and the following embodiments, the first epitaxial layer is a SiCAs layer. In one or more of the foregoing and the following embodiments, the second epitaxial layer includes a SiP layer. In one or more of the foregoing and the following embodiments, the third epitaxial layer includes at least one selected from the group consisting of a SiAs layer, a SiC layer, a SiCAs layer and a SiCP layer. In one or more of the foregoing and the following embodiments, the third epitaxial layer includes one of a SiAs layer, a SiC layer and a SiCAs layer. In one or more of the foregoing and the following embodiments, the third epitaxial layer is a SiAs layer. In one or more of the foregoing and the following embodiments, the third epitaxial layer is a SiC layer. In one or more of the foregoing and the following embodiments, the third epitaxial layer is a SiCAs layer. In one or more of the foregoing and the following embodiments, the third epitaxial layer includes a SiP layer having a lower P concentration than the second epitaxial layer. In one or more of the foregoing and the following embodiments, the second epitaxial layer has a greater thickness than the first epitaxial layer and the third epitaxial layer. In one or more of the foregoing and the following embodiments, a thickness of the first epitaxial layer is in a range from 1 nm to 3 nm. In one or more of the foregoing and the following embodiments, a thickness of the third epitaxial layer is in a range from 1 nm to 3 nm. In one or more of the foregoing and the following embodiments, the first epitaxial layer includes a SiAs layer and/or a SiCAs layer, and a concentration of As in the first epitaxial layer is in a range from $1\times10^{20}$ atoms/cm$^3$ to $5\times10^{21}$ atoms/cm$^3$. In one or more of the foregoing and the following embodiments, the second epitaxial layer includes a SiP layer, and a concentration of P in the SiP layer is in a range from $1\times10^{20}$ atoms/cm$^3$ to $5\times10^{21}$ atoms/cm$^3$. In one or more of the foregoing and the following embodiments, the third epitaxial layer includes a SiAs layer and/or a SiCAs layer, and a concentration of As in the third epitaxial layer is in a range from $1\times10^{20}$ atoms/cm$^3$ to $5\times10^{21}$ atoms/cm$^3$.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor wire having a channel region;
   a gate structure wrapping around the channel region;
   a source/drain region adjacent to the channel region; and
   a source/drain epitaxial layer, wherein:
   the source/drain epitaxial layer includes a first epitaxial layer epitaxially formed on the source/drain region, a second epitaxial layer epitaxially formed on the first epitaxial layer and a third epitaxial layer epitaxially formed on the second epitaxial layer, and
   the first epitaxial layer includes a SiC layer or a SiCAs layer.

2. The semiconductor device of claim 1, wherein the second epitaxial layer includes a SiP layer.

3. The semiconductor device of claim 2, wherein the third epitaxial layer includes at least one selected from the group consisting of a SiAs layer, a SiC layer, a SiCAs layer and a SiCP layer.

4. The semiconductor device of claim 3, wherein the third epitaxial layer includes one of a SiAs layer, a SiC layer and a SiCAs layer.

5. The semiconductor device of claim 3, wherein the third epitaxial layer includes a SiP layer having a lower P concentration than the second epitaxial layer.

6. The semiconductor device of claim 1, wherein the second epitaxial layer has a greater thickness than the first epitaxial layer and the third epitaxial layer.

7. The semiconductor device of claim 6, wherein a thickness of the first epitaxial layer is in a range from 1 nm to 3 nm.

8. The semiconductor device of claim 6, wherein a thickness of the third epitaxial layer is in a range from 1 nm to 3 nm.

9. The semiconductor device of claim 1, wherein:
   the first epitaxial layer includes a SiCAs layer, and
   a concentration of As in the first epitaxial layer is in a range from $1\times10^{20}$ atoms/cm$^3$ to $5\times10^{21}$ atoms/cm$^3$.

10. The semiconductor device of claim 1, wherein:
    the second epitaxial layer includes a SiP layer, and
    a concentration of P in the SiP layer is in a range from $1\times10^{20}$ atoms/cm$^3$ to $5\times10^{21}$ atoms/cm$^3$.

11. The semiconductor device of claim 1, wherein:
    the third epitaxial layer includes a SiAs layer or a SiCAs layer, and
    a concentration of As in the third epitaxial layer is in a range from $1\times10^{20}$ atoms/cm$^3$ to $5\times10^{21}$ atoms/cm$^3$.

12. The semiconductor device of claim 1, wherein:
    a plurality of semiconductor wires vertically arranged over a bottom fin structure, and
    each of the plurality of semiconductor wires has the channel region and the source/drain region.

13. The semiconductor device of claim 12, wherein the first epitaxial layer wraps around the source/drain region of each of the plurality of semiconductor wires, and the first epitaxial layer wrapping around one source/drain region is separated from the first epitaxial layer wrapping around an adjacent one source/drain region.

14. The semiconductor device of claim 13, wherein the second epitaxial layer wraps around the source/drain region covered with the first epitaxial layer, and fills gaps between adjacent source/drain regions.

15. The semiconductor device of claim 14, wherein the third epitaxial layer covers an outer surface of the second epitaxial layer and is separated from the first epitaxial layer.

16. The semiconductor device of claim 1, wherein a concentration of As in the first epitaxial layer is in a range from $1\times10^{20}$ atoms/cm$^3$ to $5\times10^{21}$ atoms/cm$^3$.

17. A semiconductor device including a gate-all-around field effect transistor (GAA FET), the GAA FET comprising:
    a plurality of semiconductor wires each having a channel region and a source/drain region adjacent to the channel region; and
    a source/drain epitaxial layer, wherein:
    the source/drain epitaxial layer includes a first epitaxial layer epitaxially wrapping around the source/drain region of each of the semiconductor wires, a second epitaxial layer epitaxially formed on the first epitaxial layer and a third epitaxial layer epitaxially formed on the second epitaxial layer,
    the second epitaxial layer includes P, the first epitaxial layer includes a SiC layer or a SiCAs layer, and the third epitaxial layer includes a SiAs layer, a SiC layer or a SiCAs layer.

18. The semiconductor device of claim 17, wherein the third epitaxial layer includes a material different from the first epitaxial layer.

19. The semiconductor device of claim 18, wherein:

the first epitaxial layer and the third epitaxial layer contain As, and a concentration of As in the first epitaxial layer is smaller than a concentration of As in the third epitaxial layer.

20. A semiconductor device including a gate-all-around field effect transistor (GAA FET), the GAA FET comprising:

a plurality of semiconductor nanowires each having a channel region and a source/drain region adjacent to the channel region; and a source/drain epitaxial layer, wherein: the source/drain epitaxial layer includes a first epitaxial layer epitaxially wrapping around on the source/drain region of each of the semiconductor nanowires, a second epitaxial layer epitaxially formed on the first epitaxial layer and a third epitaxial layer epitaxially formed on the second epitaxial layer, the first epitaxial layer includes C, and the third epitaxial layer includes at least one element of As or C, and the second epitaxial layer includes a SiAs layer, a SiC layer or a SiCAs layer.

* * * * *